US011842996B2

(12) United States Patent
Hill

(10) Patent No.: US 11,842,996 B2
(45) Date of Patent: Dec. 12, 2023

(54) TRANSISTOR WITH ODD-MODE OSCILLATION STABILIZATION CIRCUIT

(71) Applicant: NXP USA, Inc., Austin, TX (US)

(72) Inventor: Darrell Glenn Hill, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 226 days.

(21) Appl. No.: 17/456,434

(22) Filed: Nov. 24, 2021

(65) Prior Publication Data
US 2023/0163121 A1 May 25, 2023

(51) Int. Cl.
| | |
|---|---|
| H01L 27/06 | (2006.01) |
| H01L 23/48 | (2006.01) |
| H01L 23/00 | (2006.01) |
| H01L 29/423 | (2006.01) |

(52) U.S. Cl.
CPC ........ *H01L 27/0629* (2013.01); *H01L 23/481* (2013.01); *H01L 24/05* (2013.01); *H01L 29/42376* (2013.01); *H01L 2224/0555* (2013.01)

(58) Field of Classification Search
CPC ............. H01L 23/481; H01L 29/42376; H01L 2224/0555; H01L 2223/6655
See application file for complete search history.

(56) References Cited

U.S. PATENT DOCUMENTS

| | | |
|---|---|---|
| 6,020,613 A | 2/2000 | Udomoto |
| 10,629,526 B1 | 4/2020 | Hill |
| 2008/0007357 A1* | 1/2008 | Tserng ...................... H03F 1/18 331/107 G |
| 2010/0140721 A1* | 6/2010 | Takagi ..................... H03F 1/565 257/E27.06 |
| 2010/0259329 A1* | 10/2010 | Tserng ................. H01L 27/0629 330/277 |
| 2013/0001662 A1* | 1/2013 | Nishijima ................. H03F 3/24 257/E27.06 |

(Continued)

FOREIGN PATENT DOCUMENTS

| | | | | |
|---|---|---|---|---|
| EP | 2535935 A2 * | 12/2012 | ......... | H01L 23/4824 |
| EP | 2775527 A2 * | 9/2014 | ......... | H01L 29/0696 |

OTHER PUBLICATIONS

Markus Musser, "Micro-System: Gallium Nitride RF-Broad-Band High-Power Amplifier", doctoral dissertation at the Albert-Ludwigs University of Freiburg in the Breisgau, Jul. 2014, 151 pages.

*Primary Examiner* — Mamadou L Diallo
(74) *Attorney, Agent, or Firm* — Sherry W Goulay

(57) ABSTRACT

A transistor includes first and second sets of gate fingers formed in an active area of a semiconductor substrate, an input bond pad formed in the semiconductor substrate and spaced apart from the active area, a first conductive structure with a proximal end coupled to the input bond pad and a distal end coupled to the first set of gate fingers, and a second conductive structure with a proximal end coupled to the input bond pad and a distal end coupled to the second set of gate fingers. A non-conductive gap is present between the distal ends of the first and second conductive structures. The transistor further includes an odd-mode oscillation stabilization circuit that includes a first resistor with a first terminal coupled to the distal end of the first conductive structure, and a second terminal coupled to the distal end of the second conductive structure.

18 Claims, 5 Drawing Sheets

(56) References Cited

U.S. PATENT DOCUMENTS

| | | | |
|---|---|---|---|
| 2014/0014969 A1* | 1/2014 | Kunii | H01L 27/0207 |
| | | | 257/77 |
| 2014/0252658 A1* | 9/2014 | Takagi | H01L 24/42 |
| | | | 257/784 |
| 2016/0322942 A1 | 11/2016 | Lang et al. | |
| 2017/0271258 A1* | 9/2017 | Wood | H01L 23/5221 |
| 2018/0331181 A1* | 11/2018 | Peters | H01L 29/0696 |
| 2018/0356296 A1* | 12/2018 | Roig-Guitart | H01L 29/4238 |
| 2019/0102498 A1* | 4/2019 | Flowers | H03F 3/195 |
| 2020/0027850 A1* | 1/2020 | Trang | H01L 23/552 |
| 2020/0118922 A1 | 4/2020 | Hill | |
| 2020/0321458 A1* | 10/2020 | Fayed | H01L 29/42316 |
| 2020/0343352 A1* | 10/2020 | Trang | H01L 29/41725 |
| 2021/0134968 A1* | 5/2021 | Haeberlen | H01L 23/5223 |
| 2021/0313282 A1* | 10/2021 | Noori | H03F 3/195 |

\* cited by examiner

TRANSISTOR WITH ODD-MODE OSCILLATION STABILIZATION CIRCUIT

TECHNICAL FIELD OF THE INVENTION

The present invention relates generally to transistors. More specifically, the present invention relates to a transistor layout utilizing a circuit configured to stabilize odd-mode oscillations in the transistor during operation.

BACKGROUND OF THE INVENTION

Radio Frequency (RF) power transistors that are sufficiently large relative to the wavelength of their maximum frequency of operation may be vulnerable to odd-mode instability, which is a phenomenon in which an undesirable oscillation becomes established in the transistor as a resonance between different parts of the transistor itself. This resonance can be viewed as a signal being amplified as it travels laterally from one end of the device to the other end and then back, reinforcing itself with each round trip. Besides just physical size and maximum operating frequency, other factors also can be relevant to whether significant odd-mode oscillations will occur within a transistor. In order to reduce or eliminate detrimental effects on transistor performance associated with odd-mode oscillations, designers strive to design transistors in which significant odd-mode oscillations are less likely to occur.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

Figure 1:
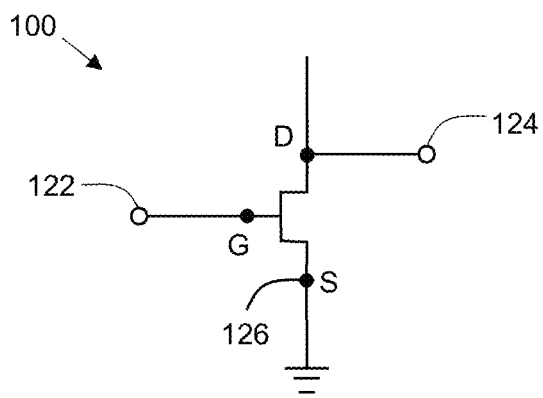
FIG. 1 shows a schematic of a common source field effect transistor (FET) circuit configuration.

An RF power transistor includes a semiconductor die with a plurality of interdigitated, elongated source and drain regions, along with elongated channel regions located between adjacent source and drain regions. The source regions are electrically connected to a ground reference (e.g., a conductive layer on the back side of the transistor die) using through substrate vias. The drain regions are contacted by elongated, conductive drain terminals, and an output end of each drain terminal is electrically connected to a drain bond pad (also referred to as an "output" bond pad herein), which extends perpendicularly to the drain terminals. The drain bond pad functions to combine the signals produced by the drain terminals, and serves as the output terminal for the power transistor. An elongated gate structure overlies each channel region, and an RF signal applied to the gate structures varies the electrical conductivity of the channels, thus varying the amount of current flowing between sets of adjacent source and drain regions. An input end of each gate structure is connected to a gate bond pad (also referred to as an "input" bond pad herein), and the gate bond pad is configured to receive an input RF signal for amplification, and to convey that signal to the gate structures. During operation, an amplified version of the input RF signal is produced at the drain bond pad.

As discussed above, RF power transistors that are sufficiently large relative to the wavelength of their maximum frequency of operation may be vulnerable to odd-mode instability due to odd-mode oscillations that occur during operation. As will be described in greater detail later, embodiments of the inventive subject matter each include an RF power transistor that includes an odd-mode oscillation stabilization circuit.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Referring to FIG. 1, FIG. 1 shows a schematic of a common source field-effect transistor (FET) device configuration 100. In common source FET configuration 100, the gate, G, serves as an input port 122 and the drain, D, serves as an output port 124. The source, S, serves as a common connection 126 in common source configuration 100 since the source is grounded as shown in FIG. 1. Thus, common source configuration 100 is an example of a two-port active device in which two of the three terminals of the FET serve as the input and output ports and the third terminal is utilized as the common connection. For clarity of discussion, transistor layouts discussed herein have common source configuration 100. However, the following discussion applies equivalently to other two-port active device configurations in which, for example, the gate may serve as the common connection or the drain may serve as the common connection.

Some FET cells (e.g., microwave power FET cells) rely on conductive through substrate vias (TSVs) to minimize common-node inductance, because the common-node inductance limits the high-frequency performance of the FET cell. Designing the location of these TSVs within a FET layout presents a tradeoff between performance and die size. FET performance may benefit from placing TSVs within the source region immediately adjacent to the gate. However, die size can be significantly reduced when the TSVs are not placed immediately adjacent to the gate.

In dealing with this tradeoff, power FET layouts have generally fallen into one of two design configurations, a "slot via" layout and an "end via" layout. In the "slot via" layout, one or more TSVs are placed in each source region between active gate regions. In the "end via" layout, the TSVs are placed outside a bounding box defined by the active regions, generally on the input side of the FET cell due to practical electromigration constraints that may be present on the higher-power output side.

Figure 2:
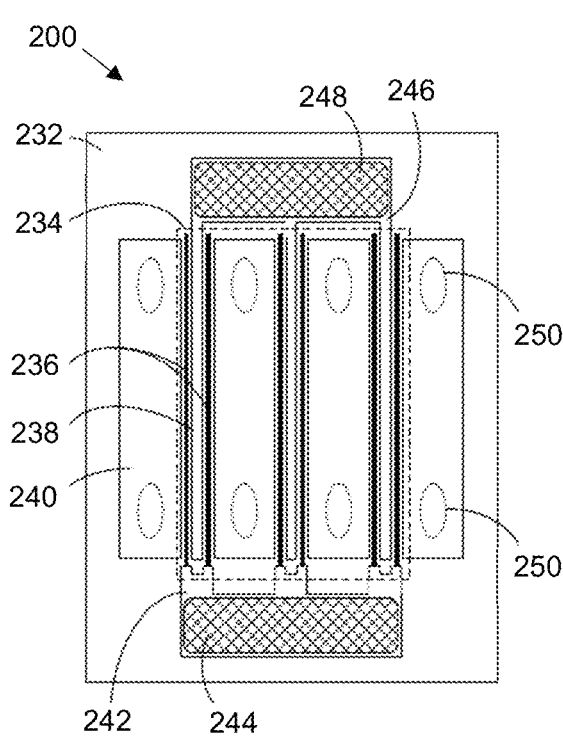
FIG. 2 shows a top view of a layout of a prior art FET cell.

FIG. 2 shows a top view of a layout of a prior art FET cell 200. FET cell 200 may employ a multi-layer circuit approach configured to be disposed in and on a semiconductor substrate 232. FET cell 200 includes an active region, generally denoted by a dashed line box 234. The active region 234 incudes multiple sets of elongated gate structures and underlying channel regions, referred to herein as gate fingers 236 (six shown), elongated drain terminals and underlying drain regions, referred to herein as drain fingers 238 (three shown), and elongated source regions and overlying source terminals, referred to herein as source fingers 240 (four shown) disposed in substrate 232. The drain and source fingers 238, 240 are arranged in a substantially parallel configuration, with a gate finger 236 positioned between sets of adjacent drain and source fingers 236, 238. Given this arrangement, the gate, drain, and source fingers 236, 238, 240 may be referred to as "interdigitated."

Gate fingers 236 are coupled together by a conductive gate bus 242, which in turn is connected to a first bond pad, referred to herein as an input bond pad 244. More specifically, the input bond pad 244 is coupled to gate bus 242 at an input side of active region 234. Similarly, drain fingers 238 are coupled together by a conductive drain bus 246, which in turn is connected to a second bond pad, referred to herein as an output bond pad 248. More specifically, the output bond pad 248 is coupled to bus 246 at an output side of active region 234. One or more TSVs 250 are electrically connected to each source finger 240. TSVs 250 extend through substrate 232 and serve to electrically connect the source fingers 240 to a ground plane (e.g., a conductive layer, not shown) on a lower surface of substrate 232. TSVs 250 are placed in each source finger 240 adjacent to gate fingers 236. Further details of FET cell 200 are not shown for clarity of illustration.

FET cell 200 represents a six gate (e.g., six gate fingers 236) single transistor "cell" having a "slot via" layout (e.g., including oblong TSVs 250 in the source regions). In a typical transistor product, the single transistor cell of FET cell 200 may be replicated side-by-side to build up a full-size transistor. In FET cell 200, peak power is typically limited by the current-handling capability (width) of drain fingers 238.

Figure 3:
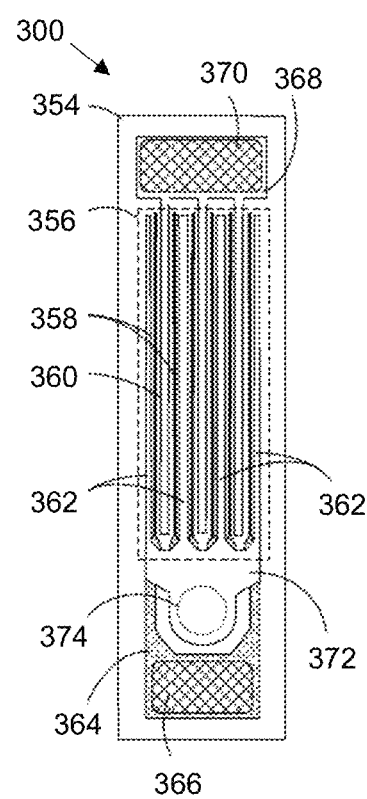
FIG. 3 shows a top view of a layout of another prior art FET cell.

FIG. 3 shows a top view of a layout of another prior art FET cell 300. FET cell 300 may also employ a multi-layer circuit approach configured to be disposed within a semiconductor substrate 354. FET cell 300 includes an active region, generally denoted by a dashed line box 356, having sets of interdigitated gate fingers 358 (six shown), drain fingers 360 (three shown), and source fingers 362 (four shown) disposed in substrate 354 in a substantially parallel configuration. All of the gate fingers 358 are coupled together by a gate bus 364 (shaded with a stippled pattern, and partially underlying feature 372). A first bond pad, referred to herein as an input bond pad 366, is coupled to the gate bus 364 at an input side of active region 356. Similarly, drain fingers 360 are coupled together by a drain bus 368, and a second bond pad, referred to herein as an output bond pad 370, is coupled to the drain bus 368 at an output side of active region 356. Source fingers 362 are coupled via a source bus 372 to a single TSV 374. TSV 374 extends through substrate 354 and serves to connect the source fingers 362 to a ground plane (e.g., a conductive layer, not shown) on a lower surface of substrate 354. Further details of FET cell 300 are not shown for clarity of illustration.

FET cell 300 represents a six gate (e.g., six gate fingers 358) single transistor cell having an "end via" layout (e.g., a single circular TSV 374). Again, in a typical transistor product, the single transistor cell of FET cell 300 may be replicated side-by-side to build up a full-size transistor. Like FET cell 200, peak power is again limited by the current-handling capability (related to the width) of drain fingers 360.

Referring concurrently to FIGS. 2 and 3, because there are no TSVs in source fingers 362 of FET cell 300, as compared to FET cell 200, the source fingers 362 can be made dramatically narrower in FET cell 300 than the source fingers 240 of FET cell 200. This is beneficial when smaller device size is desired, and thus the "end via" layout of FET cell 300 may be preferred, in some designs. However, common-node inductance (also referred to as source inductance) may now be significantly higher in FET cell 300, as compared to FET cell 200, because in FET cell 300, six gate fingers 358 share a single TSV 374, rather than sharing eight TSVs 250 as shown in the "slot via" layout of FET cell 200. The significantly higher common-node inductance of the "end via" layout of FET cell 300 may degrade the power gain relative to the "slot via" layout of FET cell 200. In addition, neither FET cell 200, 300 addresses the issue of odd-mode instability.

As discussed above, RF power FETs that are sufficiently large relative to the wavelength of their maximum frequency of operation may be vulnerable to odd-mode instability due to odd-mode oscillations that occur during operation. In a FET that includes multiple FET cells arranged in parallel, one method for addressing odd-mode oscillations is to break the input and/or output bond pads into segments, where a different bond pad segment may be coupled to each FET cell. Resistors may then be directly connected across adjacent bond pad segments. These resistors dissipate energy for any signals traveling laterally within the transistor itself (i.e., in a direction that is parallel to the length dimension of the input and output bond pads, or perpendicular to the elongated source and drain regions), while having little or no impact on the intended signal for amplification (assuming the intended signal is applied evenly across the transistor).

However, breaking the input and/or output bond pads into segments is generally undesirable for product design. The number of bond wires and the spacing between those bond wires are both critical parameters for RF power FET design. Instead, having a single unbroken, and continuous bond pad coupled to the multiple FET cells would provide maximum flexibility for these two design parameters. However, when a bond pad is broken into "N" equal segments, then the product designer must ensure that the number of bond wires is a multiple of N. This mathematically restricted number of bond wires may limit the ability to achieve desired performance. Additionally, no bond wires can be placed in the gaps between bond pad segments, and thus the number of bond wires connected to the transistor is reduced. Further still, it is undesirable to have different numbers of bond wires coupled to each bond pad segment, as this may result in the transistor being driven unevenly, and performance may degrade accordingly.

Embodiments of the inventive subject matter include an RF power transistor that includes an odd-mode oscillation stabilization circuit and an unsegmented bond pad. More specifically, various embodiments of an RF power FET include one or more FET cells, where each FET cell includes 1) a transistor active area with multiple gate fingers; 2) an unsegmented and continuous bond pad spaced apart from the active area; 3) an odd-mode oscillation stabilization circuit that includes a resistor with first and second terminals connected between two of the multiple gate fingers; and 4) two distinct conductive structures connected between the unsegmented bond pad and each of the first and second resistor terminals. In further embodiments, each FET cell also includes a TSV for source region grounding located in the space between the unsegmented bond pad and the transistor active area, and the distinct conductive structures connected between the unsegmented bond pad and the resistor may be positioned on opposite sides of the TSV.

Referring now to FIG. 4 (including FIGS. 4A-4D), various views of a layout of a FET cell 400 are shown, in accordance with an embodiment of the present invention. More specifically, FIG. 4A shows a top view of FET cell 400, FIG. 4B shows a partial top view of FET cell 400 that depicts more clearly the features associated with the input bond pad and the connections to the gate fingers, FIG. 4C is a cross-sectional view of the FET cell 400 of FIG. 4A through line 4C-4C, and FIG. 4D is a cross-sectional view of the FET cell 400 of FIG. 4A through line 4D-4D.

FET cell 400 may employ a multi-layer circuit approach configured to be disposed within a semiconductor substrate 402. As best shown in FIGS. 4C and 4D, the semiconductor substrate 402 includes a base semiconductor substrate 480 and a build-up structure 490 coupled to the top surface of the base semiconductor substrate 480. The base semiconductor substrate 480 may be formed, for example, from bulk or composite semiconductor materials (e.g., silicon (Si), gallium nitride (GaN), gallium arsenide (GaAs), silicon-on-insulator (SoI), GaN-on-insulator (e.g., GaN on Si, GaN on silicon carbide, GaN on sapphire, and so on), or other suitable materials). The build-up structure 490 includes multiple dielectric layers that separate multiple patterned conductive layers 492, 493, 494, 495, along with conductive vias (e.g., vias 452, 462) that electrically connect portions of the conductive layers 492-495. Although FIGS. 4C and 4D illustrate a build-up structure 490 with four patterned conductive layers 492-495, other embodiments may include more or fewer conductive layers. In addition, although various features are illustrated within particular ones of the conductive layers 492-495, such features may be located in different layers than those depicted. In other words, in FIG. 4A, although the illustrated embodiment shows portions of below-described source bus 444 overlying portions of the below-described first and second conductive structures 450, 460 of the gate bus 430, in alternate embodiments, the portions of the first and second conductive structures 450, 460 of the gate bus 430 may instead overlie portions of the source bus 444.

FET cell 400 includes an active region 404 formed in substrate 402. Active region 404 is bounded by an outer periphery 406, generally represented by a dashed line box. Active region 404 includes sets of interdigitated input gate fingers 410, 411, 412, 413, 414, 415 (six shown), output drain fingers 416, 417, 418 (three shown), and common source fingers 420, 421, 422, 423 (four shown) disposed within substrate 402 and oriented substantially parallel to one another. In alternate embodiments, a FET cell may include more or fewer gate fingers, drain fingers, and source fingers. For example, in some embodiments, a FET call may include as few as two gate fingers, one drain finger, and two source fingers (or two gate fingers, two drain fingers, and one source finger, if the locations of the source and drain regions are switched).

Figure 4A:
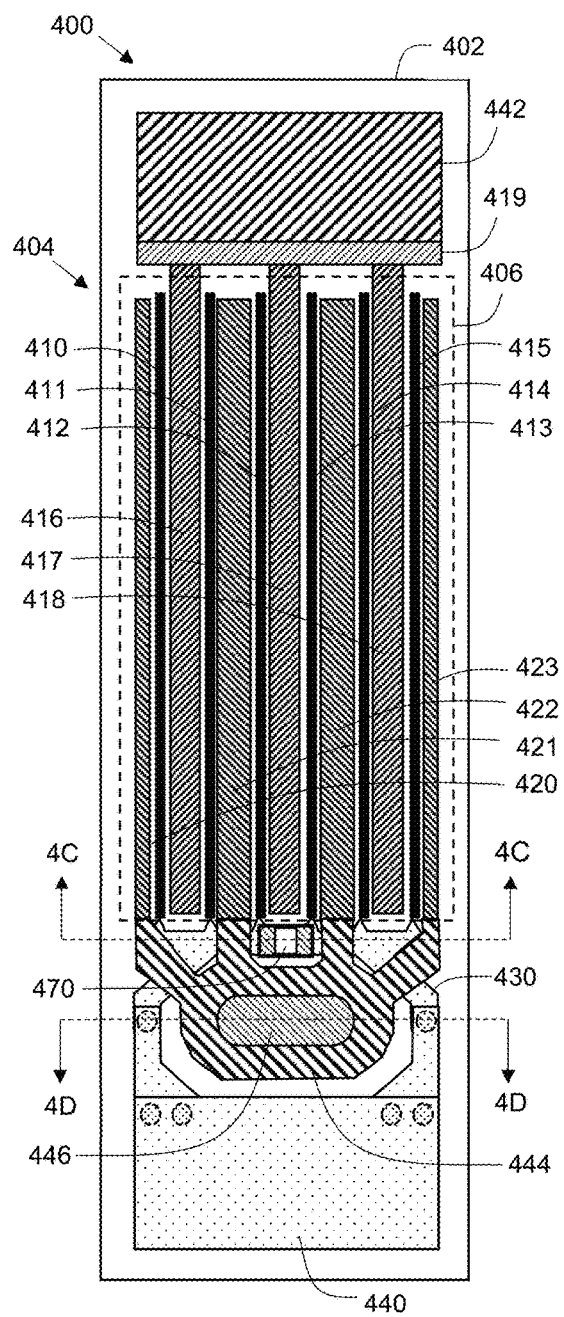
FIGS. 4A, 4B, 4C, and 4D (referred to collectively as FIG. 4) show top, partial top, and cross-sectional views of a layout of a FET cell in accordance with an embodiment of the present invention.
Figure 4B:
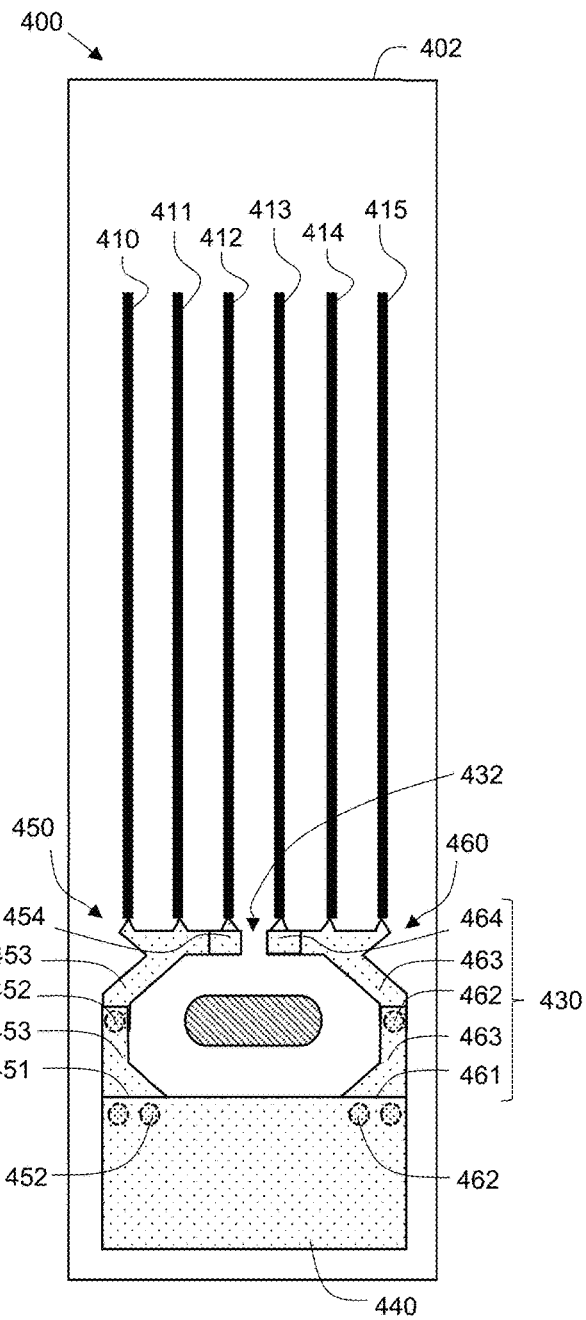
Figure 4C:
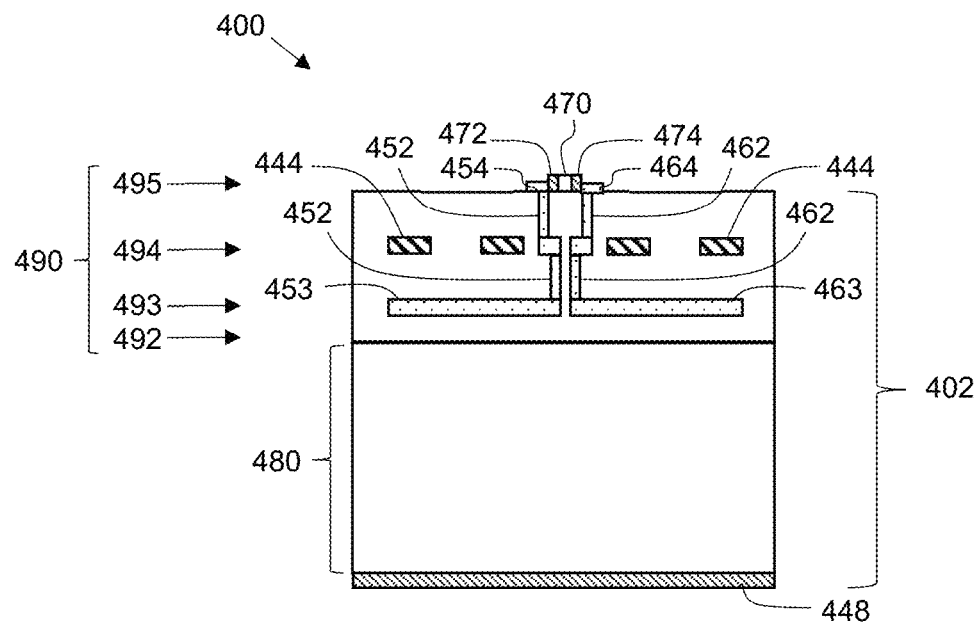
Figure 4D:
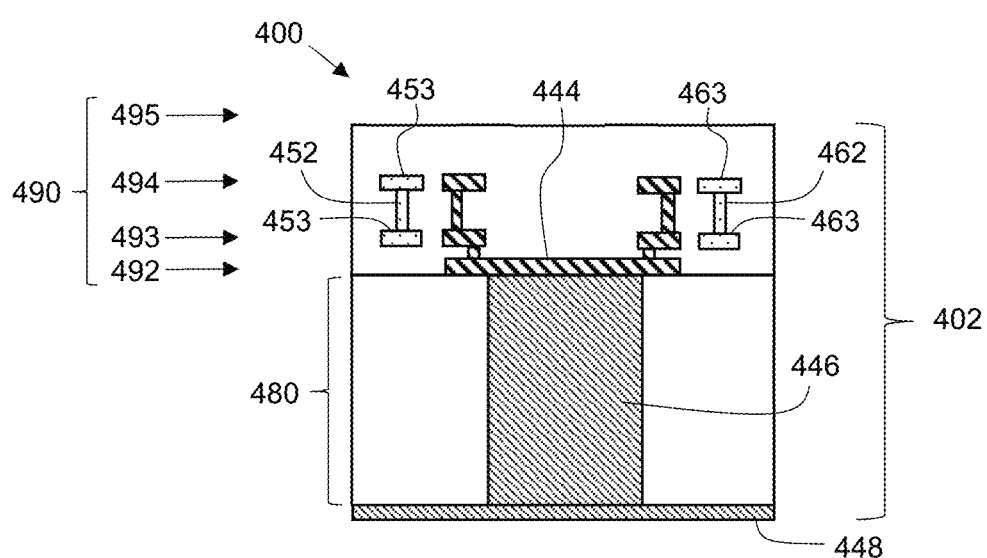

As most clearly shown in FIG. 4B, in which various features from FIG. 4A are removed for clarity, gate fingers 410-415 are coupled together by a gate bus 430. A first bond pad, referred to herein as an input bond pad 440, is coupled to the gate bus 430 at an input side of active region 404. The input bond pad 440 is positioned outside of outer periphery 406 of active region 404 at a first longitudinal end of the interdigitated set of gate, drain and source fingers 410-415, 416-418, 420-423.

According to an embodiment, the gate bus 430 includes a first conductive structure 450 with a proximal end coupled to the input bond pad 440 in a first location 451, and a second conductive structure 460 with a proximal end coupled to the input bond pad 440 in a second location 461 that is separated across a portion of the input bond pad 440 from the first location 451. In order to readily distinguish the various structures in the various metal layers, gate bus 430 interconnecting gate fingers 410-415 to input bond pad 440 are shaded with a stippled pattern.

In the illustrated embodiment, the first conductive structure 450 includes a series-coupled arrangement of conductive vias 452, conductive lines 453, and a conductive terminal 454 at a distal end of the first conductive structure 450. Similarly, the second conductive structure 460 includes a series-coupled arrangement of conductive vias 462, conductive lines 463, and a conductive terminal 464 at a distal end of the second conductive structure 460. As best visible in FIG. 4B, the first and second conductive structures 450, 460 may be mirror images of each other, which are disposed on opposite sides of the source TSV 446, which will be described later. As also best visible in FIG. 4B, a non-conductive gap 432 is present between the conductive terminals 454, 464, so that the conductive terminals 454, 464 are not electrically coupled at the distal ends of the first and second conductive structures 450, 460. Said another way, the non-conductive gap 432 is present between the distal ends of the first and second conductive structures 450, 460, so that the distal ends of the first and second conductive structures 450, 460 are not directly electrically coupled together across the non-conductive gap 432.

Proximal ends of a first set of the gate fingers 410-412 are directly electrically connected to the first conductive structure 450, and proximal ends of a second set of the gate fingers 413-415 are directly electrically connected to the second conductive structure 460. Accordingly, the first conductive structure 450 provides a continuous first conductive path between the first set of gate fingers 410-412 and the input bond pad 440, and the second conductive structure 460 provides a continuous second conductive path between the second set of gate fingers 413-415 and the input bond pad 440. Although FIGS. 4A and 4B show a first set of three gate fingers 410-412 coupled to the first conductive structure 450, and a second set of three gate fingers 413-415 coupled to the second conductive structure 460, in other embodiments, the first and second set of gate fingers may have fewer or more than three gate fingers, or otherwise may be differently defined. For example, in an alternate embodiment, the first set of gate fingers may include fewer fingers (e.g., only one finger 410 or two fingers 410 and 411) and the second set of gate fingers may include more fingers (e.g., fingers 413-415 plus finger 412 or fingers 412 and 411), or vice versa. As another example, the first set of gate fingers may include only a single first gate finger, and the second set of gate fingers may include only a single second gate finger.

According to an embodiment, an odd-mode oscillation stabilization circuit that includes a resistor 470 (FIGS. 4A, 4C) is coupled across the distal ends of the first and second conductive structures 450, 460. More specifically, and as best shown in FIG. 4C, the resistor 470 may be an integrated resistor or a discrete resistor with a first terminal 472 connected to terminal 454, and a second terminal 474 connected to terminal 464. In embodiments in which the resistor 470 is an integrated resistor, the resistor 470 may be formed from a strip or body of resistive material (e.g., polysilicon or other suitable materials) that is integrally formed with the semiconductor substrate 402. The body of resistive material may have a first end (or first terminal) connected to the terminal 454 and a second end (or second terminal) connected to terminal 464, with the resistance value being dependent upon the length, cross-sectional area, and electrical characteristics of the body of resistive material. Further, although FIG. 4C shows resistor 470 at the top surface of the substrate 402, the body of resistive material forming resistor 470 alternatively may be embedded in a layer that is below the top surface of the substrate 402. Alternatively, in embodiments in which the resistor 470 is a discrete resistor, terminals 454 and 464 may include two bond pads exposed at the top surface of the substrate 402, and the resistor 470 may include two conductive terminals that are connected to those bond pads. Either way, the resistor 470 may be considered to be connected across gap 432, or between terminals 454, 464, or between the distal ends of conductive structures 450, 460, or between two gates (e.g., between gates 412 and 413), or between two sets of gate fingers (e.g., between a first set of gate fingers 410-412 and a second set of gate fingers 413-415). According to an embodiment, the resistance value of resistor 470 is at least about 0.5 ohms, and may be as large as 5000 ohms or more. As more specific embodiments, the resistance value of resistor 470 may be about 2 ohms, 50 ohms, 100 ohms, 1500 ohms, or some other value. The resistance value of resistor 470 may be selected based on the total gate periphery on each side of the resistor 470, in some embodiments. As discussed above, the embodiment illustrated in FIGS. 4A, 4B include three gate fingers 410-412 and 413-415 coupled to each of conductive structures 450, 460, and each gate finger 410-415 has a "baseline" periphery. In an example alternate embodiment in which only one gate finger is coupled to each of conductive structures 450, 460, and each gate finger has $\frac{1}{10}^{th}$ the size of the baseline periphery, the resistance value may be multiplied by a scaling factor of 3×10=30 (i.e., the resistance value for the example alternate embodiment may be 30 times greater than the resistance value for the baseline embodiment). Essentially, the range of the resistance value is related to the total active gate periphery on each side of the resistor 470.

Referring again to FIG. 4A, proximal ends of the drain fingers 416-418 are coupled together by a drain bus 419. A second bond pad, referred to herein as an output bond pad 442, is coupled to the drain bus 419 at an output side of active region 404. The output bond pad 442 is positioned outside of outer periphery 406 of active region 404 at a second longitudinal end of the interdigitated set of gate, drain and source fingers 410-415, 416-418, 420-423. For enhanced understandability, drain fingers 416-418 and drain bus 419, which interconnects drain fingers 416-418 to output bond pad 442, are shaded with upward and rightward directed cross-hatching.

Proximal ends of source fingers 420-423 are coupled to one another via a source bus 444, and the source bus 444, in turn, is coupled to a source TSV 446 disposed outside the outer periphery 406 of active region 404 proximate input bond pad 440. The source TSV 446 more specifically is disposed between the active area 404 and the input bond pad 440, and also between the first and second conductive structures 450, 460. Accordingly, the source TSV 446 is surrounded (in the plane of the page for FIGS. 4A and 4B) by the input bond pad 440, the active area 404, and the conductive structures 450, 460. The layout of FET cell 400 thus represents an "end via" layout in which source TSV 446 is placed outside the bounding box (outer periphery 406) defined by the active region 404. Accordingly, die size can be significantly reduced (as compared to FET cell 200 of FIG. 2) by narrowing source fingers 420-423, because there are no via connections in the source fingers 420-423 of FET cell 400.

As best shown in FIG. 4D, the source TSV 446 extends through base substrate 480 (i.e., between the top and bottom surfaces of the base substrate 480), and thus serves to electrically connect the source fingers 420-423 to a common node (e.g., a ground plane 448 visible in FIGS. 4C and 4C) on a lower surface of the base substrate 480. The source TSV 446 may have a noncircular cross-section (e.g., oval or trench-shaped), as shown in FIGS. 4A and 4B, or may have a circular cross-section, in other embodiments. Again, for enhanced understandability, source fingers 420-423, source bus 444, and source TSV 446, are shaded with downward and rightward directed cross-hatching.

Figure 5:
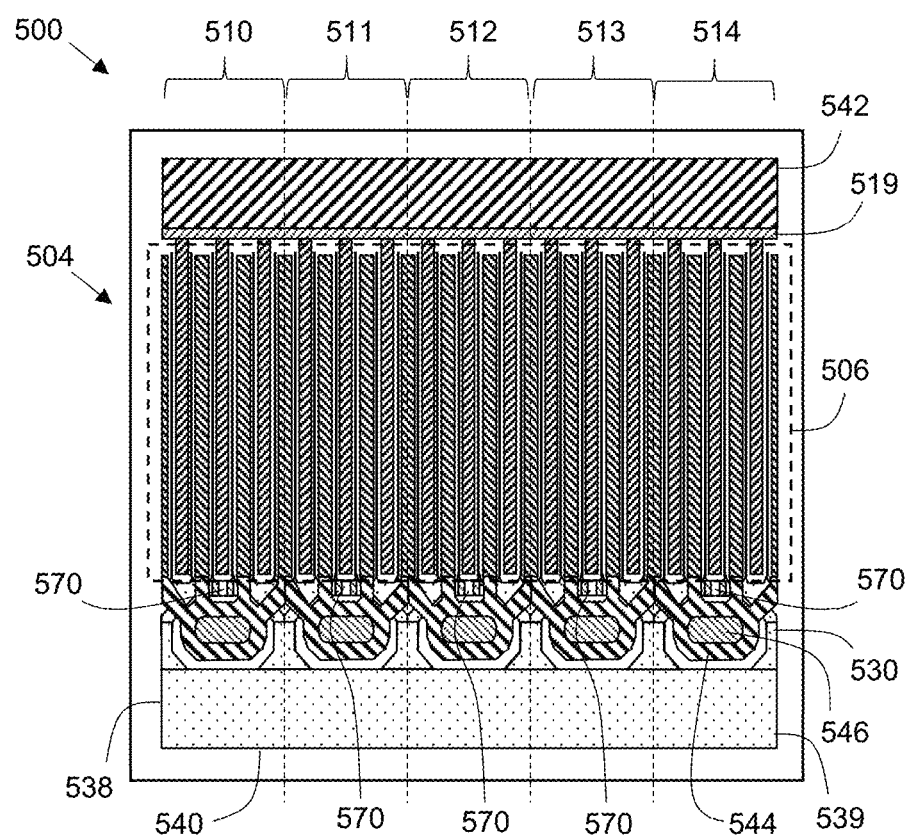
FIG. 5 shows a top view of a FET that includes multiple instances of the FET cell of FIG. 4.

In order to build a power transistor of a desired power capability, multiple instances of FET cell 400 may be replicated in parallel and interconnected with common input and output bond pads. For example, FIG. 5 shows a top view of a FET 500 that includes a number, N, of instances of the FET cell 400 of FIG. 4. More particularly, FET 500 includes five FET cells 510, 511, 512, 513, 514 (i.e., N=5) integrally formed within a single semiconductor substrate 502. Those of skill in the art would understand, based on the description herein, that the number, N, of FET cells included within a device may be greater or less than 5 (e.g., 1≤N≤20 or more, in various embodiments), depending on the desired periphery and power capability of the FET 500.

As previously discussed, semiconductor substrate 502 may include a base semiconductor substrate (e.g., base semiconductor substrate 480, FIGS. 4C, 4D) and a build-up structure (e.g., build-up structure 490, FIGS. 4C, 4D) coupled to the top surface of the base semiconductor substrate. The base semiconductor substrate may be formed, for example, from bulk or composite semiconductor materials (e.g., Si, GaN, GaAs, SoI, GaN-on-insulator, or other suitable materials). The build-up structure includes multiple dielectric layers that separate multiple patterned conductive layers, along with conductive vias that electrically connect portions of the conductive layers. The various details and embodiments associated with substrate 402 (FIG. 4), discussed above, apply also to the substrate 502 of FIG. 5, and accordingly those details and embodiments are intended to apply also to FET 500.

Each of the FET cells 510-514 includes an active region (e.g., active region 404, FIG. 4A) formed in the substrate 502. A combination of the active regions for all FET cells 510-514 is referred to as a cumulative active region 504, which is bounded by an outer periphery 506, generally represented by a dashed line box. Cumulative active region 504 includes all of the sets of interdigitated input gate fingers (e.g., gate fingers 410-415, FIGS. 4A, 4B), output drain fingers (e.g., drain fingers 416-418, FIG. 4A), and common source fingers (e.g., source fingers 420-423, FIG. 4A) for all of the FET cells 510-514, and the gate, drain, and source fingers all are oriented substantially parallel to one another.

Proximal ends of the drain fingers for all of the FET cells 510-514 are coupled together by a drain bus 519. An output bond pad 542 is coupled to the drain bus 519 at an output side of active region 504. As shown in FIG. 5, the drain bus 519 and the output bond pad 542 are elongated conductive structures that extend across the combined width of all of the FET cells 510-514. When FET 500 is incorporated into a larger electrical system (e.g., an amplifier), a plurality of wirebonds would have first ends coupled along the length of the output bond pad 542, and second ends coupled to a bond pad on a substrate that supports other portions of the electrical system.

Additionally, proximal ends of the source fingers for each of the FET cells 510-514 are coupled to one another via a source bus 544 associated with each FET cell 510-514, and each source bus 544, in turn, is coupled to a source TSV 546 disposed outside the outer periphery 506 of active region 504 (i.e., at a location between the active region 504 and the input bond pad 540, discussed below). According to an embodiment, the N source busses 544 for the N FET cells 510-514 may be electrically coupled together, as shown in FIG. 5.

According to an embodiment, the gate fingers (e.g., gate fingers 410-415, FIGS. 4A, 4B) for each FET cell 510-514 are coupled together by a gate bus 530 associated with each FET cell 510-514. An input bond pad 540, is coupled to all of the gate busses 530 at an input side of active region 504. As shown in FIG. 5, the input bond pad 540 is an elongated conductive structure that extends across the combined width of all of the FET cells 510-514. More specifically, the input bond pad 540 is formed in the semiconductor substrate 502 and spaced apart from the active area 504, and the input bond pad 540 is physically and electrically continuous between first and second ends 538, 539 of the input bond pad 540 (i.e., the input bond pad 540 is unsegmented). When FET 500 is incorporated into a larger electrical system (e.g., an amplifier), a plurality of wirebonds would have first ends coupled along the length of the input bond pad 540, and second ends coupled to a bond pad on a substrate that supports other portions of the electrical system.

According to an embodiment, each gate bus 530 includes a first conductive structure (e.g., conductive structure 450, FIGS. 4A, 4B) with a proximal end coupled to the input bond pad 540 in a first location, and a second conductive structure (e.g., conductive structure 460, FIGS. 4A, 4B) with a proximal end coupled to the input bond pad 540 in a second location that is separated across a portion of the input bond pad 540 from the first location.

As discussed above in conjunction with FIG. 4, each of the first and second conductive structures of each gate bus 530 includes a series-coupled arrangement of conductive vias, conductive lines, and a conductive terminal (e.g., terminals 454, 464, FIG. 4B) at a distal end of the first and second conductive structures, and a non-conductive gap (e.g., gap 432, FIG. 4B) is present between the conductive terminals of each gate bus 530. Proximal ends of a first set of the gate fingers (e.g., fingers 410-412, FIG. 4B) are directly electrically connected to the first conductive structure, and proximal ends of a second set of the gate fingers (e.g., fingers 413-415, FIG. 4B) are directly electrically connected to the second conductive structure. As can be seen in FIG. 5, the first and second conductive structures of adjacent FET cells (e.g., cells 510 and 511) may be formed from abutting portions of a single conductive feature.

According to an embodiment, an odd-mode oscillation stabilization circuit that includes multiple resistors 570 (e.g., multiple instances of resistor 470, FIGS. 4A, 4C) is coupled to the FET cells 510-514. More specifically, within each FET cell 510-514, a resistor 570 is coupled across the distal ends of the first and second conductive structures of that FET cell 510-514. More specifically, and as best shown in FIG. 4C, each resistor 570 may be an integrated or a discrete resistor with a first terminal (e.g., terminal 472, FIG. 4C) connected to one of the gate bus terminals (e.g., terminal 454, FIGS. 4B, 4C), and a second terminal (e.g., terminal 474, FIG. 4C) connected to the other one of the gate bus terminals (e.g., terminal 464, FIGS. 4B, 4C). In embodiments in which the resistors 570 are integrated resistors, the resistors 570 may be formed from resistive material (e.g., polysilicon or other suitable materials) that are integrally formed with the semiconductor substrate 502. Alternatively, in embodiments in which the resistors 570 are discrete resistors, the gate bus terminals may include bond pads exposed at the top surface of the FET 500, and the resistors 570 may be connected to those bond pads.

Referring both to FIGS. 4 and 5, the odd-mode oscillation stabilization circuits of FET cell 400 and FET 500 comprises resistors 470, 570, and in FET 500, also the conductive features that electrically interconnect those resistors 570 (e.g., portions of the first and second conductive structures of the gate busses 530 that interconnect resistors 570 across the width of the FET 500). The resistors 470, 570 function to dissipate energy for any signals traveling laterally within the FET cell 400 or the FET 500, while having little or no impact on the intended signal for amplification.

Because the lateral resistance required for odd-mode stabilization is included within the FET cells 400, 510-514, no additional resistors need to be added to an array of FET cells (e.g., FET cells 510-514), and accordingly the odd-mode stabilization may be achieved without segmenting the input bond pad 440, 540. As discussed above, in FET 500, the input bond pad 540 extends continuously along the combined width of the plurality of FET cells 510-514, and thus the input bond pad 540 may be described as an "unsegmented" or "physically and electrically continuous" bond pad. According to an embodiment, the bond pad 540 is formed from a single continuous portion of a single conductive layer. Essentially, the above-described embodiments provide very robust stability against odd-mode oscillations, without requiring bond pad segmentation.

In addition, by positioning the source TSVs 446, 546 between the input bond pad 440, 540 and the active area 404, 504, the first and second conductive structures (e.g., structures 450, 460, FIG. 4B) of the gate busses 430, 530 are constrained to have a minimum physical/electrical length between the input bond pad 440, 540 and the gate fingers (e.g., gate fingers 410-415, FIGS. 4A, 4B), with a corresponding associated inductance. For example, the inductance of each of the gate busses 430, 530 may be in a range of about 10 picohenries (pH) to about 200 pH, in some embodiments, or about 45 pH to about 75 pH in other embodiments, although the inductance could be smaller or larger than these ranges, as well. Even though the lateral resistor 470, 570 between two gate fingers (e.g., between gate fingers 412 and 413, FIGS. 4A, 4B) is shorted out by the input bond pad 440, 540 at DC and at low frequencies, the lateral resistor 470, 570 is not shorted out at the high frequencies at which odd-mode oscillations tend to occur (typically at least several gigahertz (GHz)) as a result of the physical and electromagnetic separation between the input bond pad 440, 540 and the gate fingers. In addition, by connecting the input bond pad 440, 540 to the gate fingers by conductive structures (e.g., structures 450, 450, FIG. 4B) that run on both sides of the source TSV (e.g., TSV 446, 546, FIGS. 4A, 5), every gate finger has a connection path back to the input bond pad that does not go through the stabilizing resistor 470, 570.

Figure 6:
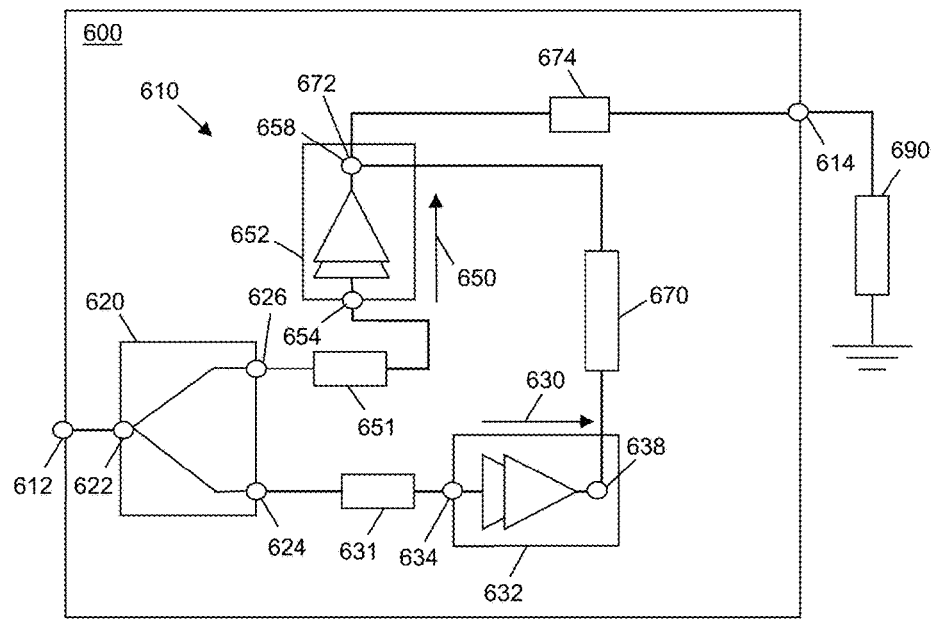
FIG. 6 shows a schematic diagram of an amplifier, in accordance with an example embodiment of the present invention.

Embodiments of FET 500 may be incorporated into power amplifiers or other circuitry. As one specific example, FIG. 6 illustrates a power amplifier module 600 that includes a Doherty amplifier 610 implemented on a module substrate. Doherty amplifier 610 includes an RF input node 612, an RF output node 614, a power splitter 620, a carrier amplifier path 630 with one or more carrier amplifier dies, a peaking amplifier path 650 with one or more peaking amplifier dies, a phase delay and impedance inversion element 670, and a combining node 672.

When incorporated into a larger RF system, the RF input node 612 is coupled to an RF signal source, and the RF output node 614 is coupled to a load 690 (e.g., an antenna or other load). The RF signal source provides an input RF signal, which is an analog signal that includes spectral energy that typically is centered around one or more carrier frequencies. Fundamentally, the Doherty amplifier 610 is configured to amplify the input RF signal, and to produce an amplified RF signal at the RF output node 614.

The power splitter 620 has an input 622 and two outputs 624, 626, in an embodiment. The power splitter input 622 is coupled to the RF input node 612 to receive the input RF signal. The power splitter 620 is configured to divide the RF input signal received at input 622 into first and second RF signals (or carrier and peaking signals), which are provided to the carrier and peaking amplifier paths 630, 650 through outputs 624, 626. According to an embodiment, the power splitter 620 includes a first phase shift element, which is configured to impart a first phase shift (e.g., about a 90 degree phase shift) to the peaking signal before it is provided to output 626. Accordingly, at outputs 624 and 626, the carrier and peaking signals may be about 90 degrees out of phase from each other.

The outputs 624, 626 of the power splitter 620 are connected to the carrier and peaking amplifier paths 630, 650, respectively. The carrier amplifier path 630 is configured to amplify the carrier signal from the power splitter 620, and to provide the amplified carrier signal to the power combining node 672. Similarly, the peaking amplifier path 650 is configured to amplify the peaking signal from the power splitter 620, and to provide the amplified peaking signal to the power combining node 672, where the paths 630, 650 are designed so that the amplified carrier and peaking signals arrive in phase with each other at the power combining node 672.

According to an embodiment, the carrier amplifier path 630 includes an input circuit 631 (e.g., including an impedance matching circuit), a carrier amplifier 632 implemented using one or more carrier amplifier dies (e.g., one or more instances of FET 500, FIG. 5), and a phase shift and impedance inversion element 670.

The carrier amplifier 632 includes an RF input terminal 634, an RF output terminal 638, and one or more amplification stages coupled between the input and output terminals 634, 638, in various embodiments. The RF input terminal 634 is coupled through input circuit 631 to the first output 624 of the power splitter 620, and thus the RF input terminal 634 receives the carrier signal produced by the power splitter 620.

Each amplification stage of the carrier amplifier 632 includes a power transistor. In a single-stage carrier amplifier 632, a single power transistor may be implemented on a single power amplifier die. In a two-stage carrier amplifier 632, two power transistors may be implemented on a single power amplifier die, or each power amplifier may be implemented on a separate die.

Either way, each power transistor includes a control terminal and first and second current-carrying terminals (e.g., a drain terminal and a source terminal). In a single-stage device, which would include a single power transistor, the control terminal is electrically connected to the RF input terminal 634, one of the current-carrying terminals (e.g., the drain terminal) is electrically connected to the RF output terminal 638, and the other current-carrying terminal (e.g., the source terminal) is electrically connected to a ground reference (or another voltage reference). Conversely, a two-stage amplifier would include two power transistors coupled in series, where a first transistor functions as a driver amplifier transistor that has a relatively low gain, and a second transistor functions as a final-stage amplifier transistor that has a relatively high gain.

The RF output terminal 638 of the carrier amplifier 632 is coupled to the power combining node 672 through phase shift and impedance inversion element 670, in an embodiment. According to an embodiment, the impedance inversion element is a lambda/4 ($\lambda/4$) transmission line phase shift element (e.g., a microstrip line), which imparts about a 90 degree relative phase shift to the carrier signal after amplification by the carrier amplifier 632. A first end of the impedance inversion element 670 is coupled to the RF output terminal 638 of the carrier amplifier 632, and a second end of the phase shift element 670 is coupled to the power combining node 672.

Reference is now made to the peaking amplifier path 650, which includes a peaking amplifier 652 and an input circuit 651 (e.g., including an impedance matching circuit), in an embodiment. The peaking amplifier 652 includes an RF input terminal 654, an RF output terminal 658, and one or more amplification stages coupled between the input and output terminals 654, 658, in various embodiments. The RF input terminal 654 is coupled to the second output 626 of the power splitter 620, and thus the RF input terminal 654 receives the peaking signal produced by the power splitter 620.

As with the carrier amplifier 632, each amplification stage of the peaking amplifier 652 includes a power transistor with a control terminal and first and second current-carrying terminals. The power transistor(s) of the peaking amplifier 652 may be electrically coupled between the RF input and output terminals 654, 658 in a manner similar to that described above in conjunction with the description of the carrier amplifier 632. Additional other details discussed with in conjunction with the description of the carrier amplifier 632 also apply to the peaking amplifier 652, and those additional details are not reiterated here for brevity.

The RF output terminal 658 of the peaking amplifier 652 is coupled to the power combining node 672. According to an embodiment, the RF output terminal 658 of the peaking amplifier 652 and the combining node 672 are implemented with a common element. More specifically, in an embodiment, the RF output terminal 658 of the peaking amplifier 652 is configured to function both as the combining node 672 and as the output terminal 658 of the peaking amplifier 652. To facilitate combination of the amplified carrier and peaking signals, and as mentioned above, the RF output terminal 658 (and thus the combining node 672) is connected to the second end of the phase shift and impedance inversion element 670. In other embodiments, the combining node 672 may be a separate element from the RF output terminal 658.

Either way, the amplified carrier and peaking RF signals combine in phase at the combining node 672. The combining node 672 is electrically coupled to the RF output node 614 to provide the amplified and combined RF output signal to the RF output node 614. In an embodiment, an output impedance matching network 674 between the combining node 672 and the RF output node 614 functions to present proper load impedances to each of the carrier and peaking amplifier 632, 652. The resulting amplified RF output signal is produced at RF output node 614, to which an output load 690 (e.g., an antenna) is connected.

Amplifier 610 is configured so that the carrier amplifier path 630 provides amplification for relatively low level input signals, and both amplification paths 630, 650 operate in combination to provide amplification for relatively high level input signals. This may be accomplished, for example, by biasing the carrier amplifier 632 so that the carrier amplifier 632 operates in a class AB mode, and biasing the peaking amplifier 652 so that the peaking amplifier 652 operates in a class C mode.

Figure 7:
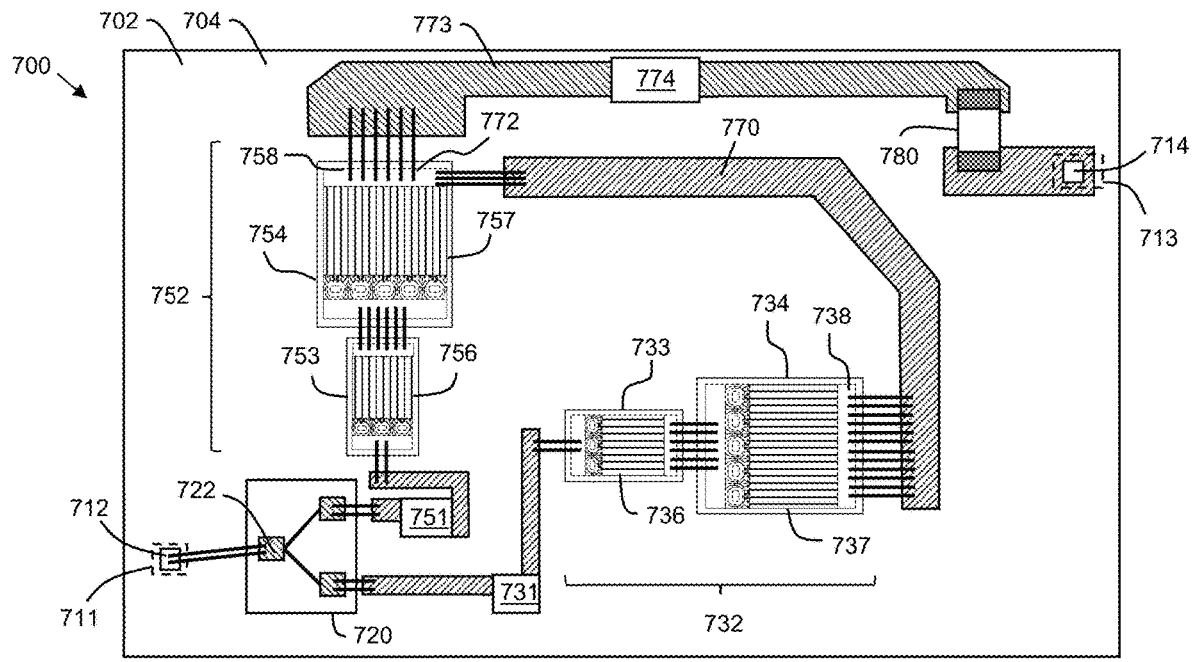
FIG. 7 shows a top view of an amplifier module, in accordance with an example embodiment of the present invention.

An example of a physical implementation of the Doherty amplifier circuit of FIG. 6 now will be described in detail in conjunction with FIG. 7. More specifically, FIG. 7 shows a top view of a Doherty amplifier module 700, in accordance with an example configuration of the present invention.

Doherty amplifier module 700 includes a substrate 702, a power splitter 720 (e.g., power splitter 620, FIG. 6), driver-stage and final-stage carrier amplifier dies 733, 734 (e.g., corresponding to carrier amplifier 632, FIG. 6), driver-stage and final-stage peaking amplifier dies 753, 754 (e.g., corresponding to peaking amplifier 652, FIG. 6), a phase shift and impedance inversion element 770 (e.g., phase shift and impedance inversion element 670, FIG. 6), and various other circuit elements, which will be discussed in more detail below. Each of the dies 733, 734, 753, 754 may be mounted over a heat dissipation structure (e.g., a conductive coin or thermal vias) that extends through the substrate 702, and which enables heat produced by the dies 733, 734, 753, 754 during operation to be transferred though the substrate 702 to a system-level heat dissipation structure.

Doherty amplifier module 700 may be implemented as a land grid array (LGA) module, for example. Accordingly, substrate 702 has a component mounting surface 704 and a land surface (not shown) opposite component mounting surface 704. Component mounting surface 704 and the components mounted to that surface 704 optionally may be covered with an encapsulant material (not shown). Alternatively, the components could be contained within an air cavity, which is defined by various structures (not illustrated) overlying mounting surface 704.

A conductive landing pad 711 (represented by a dashed line box) exposed at the land surface is electrically coupled through substrate 702 to a conductive contact 712 at the mounting surface 704. Landing pad 711 and contact 712, along with the electrical connections between them, function as the RF input node (e.g., RF input node 612, FIG. 6) for module 700. Similarly, another conductive landing pad 713 (represented by a dashed line box) exposed at the land surface is electrically coupled through substrate 702 to another conductive contact 714 at the mounting surface 704. Landing pad 713 and contact 714, along with the electrical connections between them, function as the RF output node (e.g., RF output node 614, FIG. 6) for module 700.

Power splitter 720 is coupled to mounting surface 704, and may include one or more discrete die and/or components, although it is represented in FIG. 7 as a single element. Power splitter 720 includes an input terminal 722 (e.g., input 622, FIG. 6) and two output terminals, not numbered (e.g., outputs 624, 626, FIG. 6). Input terminal 722 is electrically coupled (e.g., through wirebonds, as shown) to conductive contact 712 to receive an input RF signal. In addition, the output terminals of power splitter 720 are electrically coupled (e.g., through additional wirebonds, as shown) to conductive traces, not numbered, at the mounting surface 704. Power splitter 720 is configured to split the power of the input RF signal received through input terminal 722 into first and second RF signals (e.g., carrier and peaking signals), which are produced at the output terminals of the power splitter 720. In addition, power splitter 720 may include one or more phase shift elements configured to impart about a 90 degree phase shift to the RF signal provided at one of the output terminals of the power splitter 720. Power splitter 720 may consist of a single surface-mount component, or may consist of multiple fixed-value, passive components.

The first RF signal produced by the power splitter 720 is amplified through a carrier amplifier path. The carrier amplifier path includes an input circuit 731 (e.g., input circuit 631, FIG. 6), a carrier amplifier 732, and a phase shift and impedance inversion element 770 (e.g., impedance inversion element 670, FIG. 6).

Input circuit 731 is configured to provide proper impedance matching between the first output of power splitter 720 and the input to the carrier amplifier 732. The illustrated embodiment of carrier amplifier 732 embodies a two-stage amplifier. More specifically, the carrier amplifier 732 includes a driver-stage carrier amplifier die 733 coupled in series to a final-stage carrier amplifier die 734. Driver-stage carrier amplifier die 733 includes a first power transistor 736 (e.g., an instance of an embodiment of FET 500, FIG. 5), which is configured to apply a relatively low gain to the carrier signal. Final-stage carrier amplifier die 734 includes a second power transistor 737 (e.g., another instance of an embodiment of FET 500, FIG. 5), which is configured to apply a relatively high gain to the carrier signal after preliminary amplification by the driver-stage carrier amplifier die 733. Although not shown in FIG. 7, an impedance matching circuit may be implemented between the first and second power transistors 736, 737. In other embodiments, the power transistors 736, 737 may be integrated onto a single die. In still other embodiments, the carrier amplifier 732 may embody a single stage amplifier (i.e., including only one carrier amplifier die), or may include more than two amplification stages.

An amplified RF carrier signal is produced by the final-stage carrier amplifier die 734 at output terminal 738. In the illustrated example, the RF output terminal 738 is electrically coupled to a first end of phase shift and impedance inversion element 770 with a plurality of parallel, closely spaced wirebonds. Phase shift and impedance inversion element 770 may be implemented with a transmission line (e.g., a microstrip line) having an electrical length of about lambda/4 ($\lambda/4$) or less. The transmission line has a first end that is proximate to the final-stage carrier amplifier die 734 and a second end that is proximate to the final-stage peaking amplifier die 754, discussed below.

Moving back to power splitter 720, the second RF signal produced by the power splitter 720 is amplified through a peaking amplifier path. The peaking amplifier path includes an input circuit 751 (e.g., input circuit 651, FIG. 6), and a peaking amplifier 752.

Input circuit 751 is configured to provide proper impedance matching between the second output of power splitter 720 and the input to the peaking amplifier 752. The illustrated embodiment of peaking amplifier 752 embodies a two-stage amplifier. More specifically, the peaking amplifier 752 includes a driver-stage peaking amplifier die 753 coupled in series to a final-stage peaking amplifier die 754. Driver-stage peaking amplifier die 753 includes a third power transistor 756 (e.g., another instance of an embodiment of FET 500, FIG. 5), which is configured to apply a relatively low gain to the peaking signal. Final-stage peaking amplifier die 754 includes a fourth power transistor 757 (e.g., another instance of an embodiment of FET 500, FIG. 5), which is configured to apply a relatively high gain to the peaking signal after preliminary amplification by the driver-stage peaking amplifier die 753. Although not shown in FIG. 7, an impedance matching circuit may be implemented between the third and fourth power transistors 756, 757. In other embodiments, the power transistors 756, 757 may be integrated onto a single die. In still other embodiments, the peaking amplifier 752 may embody a single stage amplifier (i.e., including only one peaking amplifier die), or may include more than two amplification stages.

An amplified RF peaking signal is produced by the final-stage peaking amplifier die 754 at RF output terminal 758. RF output terminal 758 also functions as a combining node 772 (e.g., combining node 672, FIG. 6) at which the amplified and delayed carrier amplifier signal is combined, in phase, with an amplified peaking amplifier signal. To receive the amplified and delayed carrier amplifier signal, RF output terminal 758 (and thus combining node 672) is electrically coupled to a second end of the impedance inversion element 770 with a wirebond array. More specifically, the amplified carrier signal produced by the carrier amplifier 732 and the amplified peaking signal produced by the peaking amplifier 752 are received at the combining node 772, where they combine in phase.

RF output terminal 758 (and combining node 772) is electrically coupled to a conductive output trace 773 with a wirebond array. An output impedance matching network 774 (e.g., matching network 674, FIG. 6) is implemented along output trace 773. In addition, a decoupling capacitor 780 may be coupled along output trace 773. Output impedance matching network 774 functions to present the proper load impedance to combining node 772. Although the detail is not shown in FIG. 7, the output impedance matching network 774 may include various discrete and/or integrated components (e.g., capacitors, inductors, and/or resistors) to provide the desired impedance matching. Output impedance matching network 774 is electrically coupled to a conductive contact 714 at mounting surface 704. Conductive contact 714 is in electrical contact with a landing pad 713 exposed at the land surface of substrate 702. Landing pad 713 and contact 714, along with the electrical connections between them, function as the RF output node (e.g., RF output node 614, FIG. 6) for module 700.

As indicated above, each of the transistors 736, 737, 756, 757 may be a FET (e.g., an embodiment of FET 500, FIG. 5), which includes an odd-mode oscillation stabilization circuit as described above. In various alternate embodiments, only some (but not all) of the transistors 736, 737, 756, 757 may include odd-mode oscillation stabilization circuits. For example, in some alternate embodiments, embodiments of FETs with odd-mode oscillation stabilization circuits (e.g., FET 500, FIG. 5) may be used where die size is not constrained primarily by thermal requirements (e.g., in peaking amplifier 754), whereas differently configured FETs may be used elsewhere (e.g., in carrier amplifier die 734).

The above described embodiment includes two-way Doherty power amplifier implementation, which includes a carrier amplifier and a peaking amplifier. According to other embodiments, a Doherty power amplifier may include more than one peaking amplifier, or module 700 may be modified to implement types of amplifiers other than Doherty amplifiers. That is, various modifications may be made to module 700 while still including transistors that have an odd-mode oscillation stabilization circuit as described in detail above.

Further, although embodiments have been described herein with respect to a Doherty power amplifier, those of skill in the art would understand, based on the description herein, that embodiments of the inventive subject matter may be used in conjunction with virtually any type of single- or multiple-path amplifier. Accordingly, the transistor embodiments having the odd-mode oscillation stabilization circuits described herein are not limited to use with Doherty amplifiers, nor are the transistor embodiments having odd-mode oscillation stabilization circuits limited to use with amplifiers having only two amplification paths. Rather, the transistor embodiments having the odd-mode oscillation stabilization circuit may be implemented within a wide variety of circuits.

An embodiment of a transistor includes first and second sets of gate fingers formed in an active area of a semiconductor substrate, an input bond pad formed in the semiconductor substrate and spaced apart from the active area, a first conductive structure with a proximal end coupled to the input bond pad and a distal end coupled to the first set of gate fingers, and a second conductive structure with a proximal end coupled to the input bond pad and a distal end coupled to the second set of gate fingers. A non-conductive gap is present between the distal ends of the first and second conductive structures. The transistor further includes an odd-mode oscillation stabilization circuit that includes a first resistor with a first terminal coupled to the distal end of the first conductive structure, and a second terminal coupled to the distal end of the second conductive structure.

Another embodiment of a transistor includes a semiconductor substrate with an active area, and an input bond pad formed in the semiconductor substrate and spaced apart from the active area. The input bond pad is physically and electrically continuous between first and second ends of the input bond pad. The transistor further includes first and second transistor cells. The first transistor cell includes a first set of gate fingers and a second set of gate fingers formed in the active area, a first conductive structure with a proximal end coupled to the input bond pad between the first and second ends and a distal end coupled to the first set of gate fingers, and a second conductive structure with a proximal end coupled to the input bond pad between the first and second ends and a distal end coupled to the second set of gate fingers. A first non-conductive gap is present between the distal ends of the first and second conductive structures. The second transistor cell includes a third set of gate fingers and a fourth set of gate fingers formed in the active area, a third conductive structure with a proximal end coupled to the input bond pad between the first and second ends and a distal end coupled to the third set of gate fingers, and a fourth conductive structure with a proximal end coupled to the input bond pad between the first and second ends and a distal end coupled to the fourth set of gate fingers. A second non-conductive gap is present between the distal ends of the third and fourth conductive structures. The transistor further includes an odd-mode oscillation stabilization circuit that includes a first resistor and a second resistor. The first resistor is coupled across the first gap to the distal ends of the first and second conductive structures, and the second resistor is coupled across the second gap to the distal ends of the third and fourth conductive structures.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A transistor comprising:
a semiconductor substrate;
a first set of gate fingers and a second set of gate fingers formed in an active area of the semiconductor substrate;
an input bond pad formed in the semiconductor substrate and spaced apart from the active area;
a first conductive structure with a proximal end coupled to the input bond pad and a distal end coupled to the first set of gate fingers;
a second conductive structure with a proximal end coupled to the input bond pad and a distal end coupled to the second set of gate fingers, wherein a non-conductive gap is present between the distal ends of the first and second conductive structures; and
an odd-mode oscillation stabilization circuit that includes a first resistor with first and second terminals, wherein the first terminal is coupled to the first set of gate fingers at the distal end of the first conductive structure, and the second terminal is coupled to the second set of gate fingers at the distal end of the second conductive structure.

2. The transistor of claim 1, further comprising:
a through substrate via disposed in the semiconductor substrate between the active area and the input bond pad, wherein the first and second conductive structures are located on opposite sides of the through substrate via.

3. The transistor of claim 2, further comprising:
a source finger formed in the active area, wherein the source finger is electrically coupled to the through substrate via; and
a conductive layer on a bottom surface of the semiconductor substrate, wherein the through substrate via electrically connects the source finger and the conductive layer.

4. The transistor of claim 1, wherein:
the first conductive structure includes a first bond pad at the distal end of the first conductive structure;
the second conductive structure includes a second bond pad at the distal end of the second conductive structure; and
the first resistor is a surface mount component coupled to the first and second bond pads.

5. The transistor of claim 1, wherein:
the first conductive structure includes a first terminal at the distal end of the first conductive structure;
the second conductive structure includes a second terminal at the distal end of the second conductive structure; and
the first resistor is integrally formed with the semiconductor substrate and includes a body of resistive material with a first end connected to the first terminal, and a second end connected to the second terminal.

6. The transistor of claim 1, wherein the first and second conductive structures each are characterized by an inductance, and wherein during operation of the transistor, the first resistor is not shorted out by the input bond pad at frequencies at which odd-mode oscillations occur.

7. The transistor of claim 1, wherein:
the proximal end of the first conductive structure is coupled to the input bond pad in a first location; and
the proximal end of the second conductive structure is coupled to the input bond pad in a second location that is separated across a portion of the input bond pad from the first location.

8. The transistor of claim 1, wherein:
the first set of gate fingers includes multiple first gate fingers; and
the second set of gate fingers includes multiple second gate fingers.

9. The transistor of claim 1, wherein:
the first set of gate fingers includes a single first gate finger; and
the second set of gate fingers includes a single second gate finger.

10. The transistor of claim 1, further comprising
a third set of gate fingers and a fourth set of gate fingers formed in the active area of the semiconductor substrate;
a third conductive structure with a proximal end coupled to the input bond pad and a distal end coupled to the third set of gate fingers; and
a fourth conductive structure with a proximal end coupled to the input bond pad and a distal end coupled to the fourth set of gate fingers, and
wherein the odd-mode oscillation stabilization circuit further includes a second resistor with first and second terminals, wherein the first terminal of the second resistor is coupled to the third set of gate fingers at the distal end of the third conductive structure, and the second terminal of the second resistor is coupled to the fourth set of gate fingers at the distal end of the fourth conductive structure, and
wherein the input bond pad is physically and electrically continuous between the proximal ends of the first, second, third, and fourth conductive structures.

11. A transistor comprising:
a semiconductor substrate with an active area;
an input bond pad formed in the semiconductor substrate and spaced apart from the active area, wherein the input bond pad is physically and electrically continuous between first and second ends of the input bond pad;

a first transistor cell that includes
　a first set of gate fingers and a second set of gate fingers formed in the active area,
　a first conductive structure with a proximal end coupled to the input bond pad between the first and second ends and a distal end coupled to the first set of gate fingers, and
　a second conductive structure with a proximal end coupled to the input bond pad between the first and second ends and a distal end coupled to the second set of gate fingers, wherein a first non-conductive gap is present between the distal ends of the first and second conductive structures;
a second transistor cell that includes
　a third set of gate fingers and a fourth set of gate fingers formed in the active area,
　a third conductive structure with a proximal end coupled to the input bond pad between the first and second ends and a distal end coupled to the third set of gate fingers, and
　a fourth conductive structure with a proximal end coupled to the input bond pad between the first and second ends and a distal end coupled to the fourth set of gate fingers, wherein a second non-conductive gap is present between the distal ends of the third and fourth conductive structures; and
an odd-mode oscillation stabilization circuit that includes a first resistor and a second resistor, wherein the first resistor is coupled across the first gap to the distal ends of the first and second conductive structures, and the second resistor is coupled across the second gap to the distal ends of the third and fourth conductive structures.

12. The transistor of claim 11, further comprising:
a first through substrate via disposed in the semiconductor substrate between the active area and the input bond pad, wherein the first and second conductive structures are located on opposite sides of the first through substrate via; and
a second through substrate via disposed in the semiconductor substrate between the active area and the input bond pad, wherein the third and fourth conductive structures are located on opposite sides of the second through substrate via.

13. The transistor of claim 12, further comprising:
a first source finger formed in the active area, wherein the first source finger is electrically coupled to the first through substrate via;
a second source finger formed in the active area, wherein the second source finger is electrically coupled to the second through substrate via; and
a conductive layer on a bottom surface of the semiconductor substrate, wherein the first and second through substrate vias electrically connect the first and second source fingers and the conductive layer.

14. The transistor of claim 11, wherein:
the first conductive structure includes a first terminal at the distal end of the first conductive structure;
the second conductive structure includes a second terminal at the distal end of the second conductive structure;
the third conductive structure includes a third terminal at the distal end of the third conductive structure;
the fourth conductive structure includes a fourth terminal at the distal end of the fourth conductive structure;
the first resistor is connected to the first and second terminals; and
the second resistor is connected to the third and fourth terminals.

15. The transistor of claim 11, wherein the first, second, third, and fourth conductive structures each are characterized by an inductance, and wherein during operation of the transistor, the first and second resistors are not shorted out by the input bond pad at frequencies at which odd-mode oscillations occur.

16. The transistor of claim 11, wherein:
the proximal end of the first conductive structure is coupled to the input bond pad in a first location;
the proximal end of the second conductive structure is coupled to the input bond pad in a second location that is separated across a portion of the input bond pad from the first location;
the proximal end of the third conductive structure is coupled to the input bond pad in a third location; and
the proximal end of the fourth conductive structure is coupled to the input bond pad in a fourth location that is separated across a portion of the input bond pad from the third location.

17. The transistor of claim 11, wherein:
the first set of gate fingers includes multiple first gate fingers; and
the second set of gate fingers includes multiple second gate fingers.

18. The transistor of claim 11, wherein:
the first set of gate fingers includes a single first gate finger; and
the second set of gate fingers includes a single second gate finger.

* * * * *